United States Patent
Brown et al.

(10) Patent No.: US 6,198,101 B1
(45) Date of Patent: Mar. 6, 2001

(54) INTEGRAL CHARGE WELL FOR A QWIP FPA

(75) Inventors: Kevin Brown; Robert J. Martin, both of Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/149,483

(22) Filed: Sep. 8, 1998

(51) Int. Cl.$^7$ .................................................. H01L 29/06
(52) U.S. Cl. ..................... 250/338.4; 250/370.08
(58) Field of Search ............... 250/338.4, 370.08

(56) References Cited

U.S. PATENT DOCUMENTS

| | | |
|---|---|---|
| 4,197,469 * | 4/1980 | Cheung .............................. 250/338.4 |
| 5,016,064 | 5/1991 | Goronkin . |
| 5,283,444 | 2/1994 | Sacks et al. . |
| 5,296,699 | 3/1994 | Deveaud-Pledran et al. . |
| 5,466,965 | 11/1995 | Meng et al. . |
| 5,479,032 | 12/1995 | Forrest et al. . |
| 5,506,419 | 4/1996 | Levine et al. . |
| 5,528,051 | 6/1996 | Nuyen . |
| 5,539,206 | 7/1996 | Schimert . |
| 5,606,175 | 2/1997 | Truscott . |

* cited by examiner

Primary Examiner—Constantine Hannaher
Assistant Examiner—Otilia Gabor
(74) Attorney, Agent, or Firm—Burns, Doane, Swecker & Mathis, LLP

(57) ABSTRACT

A quantum well infrared photodetector includes a direct connection between the charge well and detector that induces a nonlinear dynamic bias. This dynamic bias advantageously corrects for nonuniformity in the conductance of the detector. In another feature, the charge well is fabricated on the detector element by adding an extra contact layer and a dielectric layer to a standard quantum well. Very dense focal plane arrays can be produced by making the charge well a part of the infrared detector.

25 Claims, 6 Drawing Sheets

INTEGRAL CHARGE WELL FOR A QWIP FPA

BACKGROUND

Quantum Well Infrared Photodetector Focal Plane Arrays (QWIP FPA's) are conventionally used for infrared detection and imaging. Typical applications of QWIP FPA's include fiber optics communications systems, temperature sensing, night vision, eye-safe range finding, and process control. As is known in the art, QWIP FPA's are composed of arrays of detector structures, wherein each detector structure produces a signal that is transmitted through a conductor bump to an external Read Out Integrated Circuit (ROIC) unit cell. The outputs of the plurality of ROIC unit cells associated with each detector in the array produce an integrated representation of the signal from the detector. To produce this output signal, a fixed bias is applied to the detector and the detector photocurrent resulting from the bias and the incident radiation is integrated. This integration function is performed by an integration charge well (integration capacitor) that is disposed within each individual ROIC unit cell. The combined integrated outputs of the plurality of ROIC unit cells in the array produce an image corresponding to the received infrared radiation.

As shown in FIG. 1, a conventional photodetector architecture consists of the detector structure 1 physically separated from the ROIC unit cell structure 2 and electrically connected through a conductive bump 3. In this prior art photodetector architecture the integrating capacitor 4 (unit cell charge well) is physically disposed within the ROIC unit cell itself. The usable area of the ROIC unit cell is constrained by the pitch of the overlying detector in the array. This constraint on the usable area further limits the size of the charge well which is the largest component in the unit cell. As the pitch of each detector in the array is reduced to create greater detector density, the usable area of the associated unit cell must also be reduced. This reduction limits the size of the charge well and, ultimately, places limits on the density of the detector array.

To produce very high density (for example 856×480 or 1024×576) QWIP Focal Plane Arrays the detector pitch may need to be reduced to less than 18 $\mu$m. As already noted, this small pitch will limit the usable area for the unit cell charge well and also any additional unit cell storage well capacitors. Even with the use of 0.5 $\mu$m or 0.35 $\mu$m technology the available area for these capacitors in the unit cell will be very small. Additionally, there is a need to place smart focal plane array functions into the ROIC but in conventional designs, the small pitch limits the space that is available to provide these functions. Thus, the conventional photodetector architecture, in which the unit cell contains all of the components except the detector, imposes a limitation on the size and functionality of the unit cell charge well and the density of the FPA.

An additional drawback of the prior art concerns the inherent variation in the conductivities of each of the detectors in a focal plane array. These variations in conductivity result in detector elements that have different responsivities to incident radiation (e.g., high responsivity/"hot" or low responsivity/"cold" detector pixels). Variation in responsivity among the detectors across the array disadvantageously leads to nonuniform array imagery. However, the ROIC circuitry of the prior art fails to provide any compensation for this variation in responsivity. The conventional photodetector of FIG. 1 includes a ROIC injection transistor 26 that is used to bias the detector element 1. This transistor functions to provide a constant bias voltage that produces a linear response from the detector element 1. Since the detector's responsivity is also a function of the applied bias voltage, the fixed bias provided by the prior art injection transistor 26 does not compensate for the variation in responsivity due to inherent variations in detector conductivity.

SUMMARY

In a broad aspect an improved quantum well photodetector is provided. More specifically, one aspect of the invention provides for correction in the responsivity of the detector due to inherent variations in detector conductivity. This is accomplished by providing dynamic detector biasing. One way of doing this is by coupling the charge well to the detector. Another aspect of the invention consists of an improved detector structure where the charge well is fabricated on the detector itself. Fabricating the charge well on the detector structure may be accomplished by, for example, adding an extra contact layer and a dielectric layer to a standard quantum well such as a multiple quantum well. In one embodiment the added contact layer is composed of doped GaAs and the dielectric layer is composed of undoped GaAs. The dielectric layer can alternatively be constructed of other materials such as SiO, $SiO_2$, ZnS, or $MgF_2$. Fabricating the charge well on the detector structure permits a larger charge well as compared to the prior art and further permits configuration of the detector in a very high density focal plane array.

BRIEF DESCRIPTION OF THE DRAWINGS

The objects and advantages of the invention will be understood by reading the following detailed description in conjunction with the drawings in which:

FIG. 5(*b*) is a structural diagram illustrating the expanded schematic of FIG. 5(*a*).

DETAILED DESCRIPTION

Figure 1:
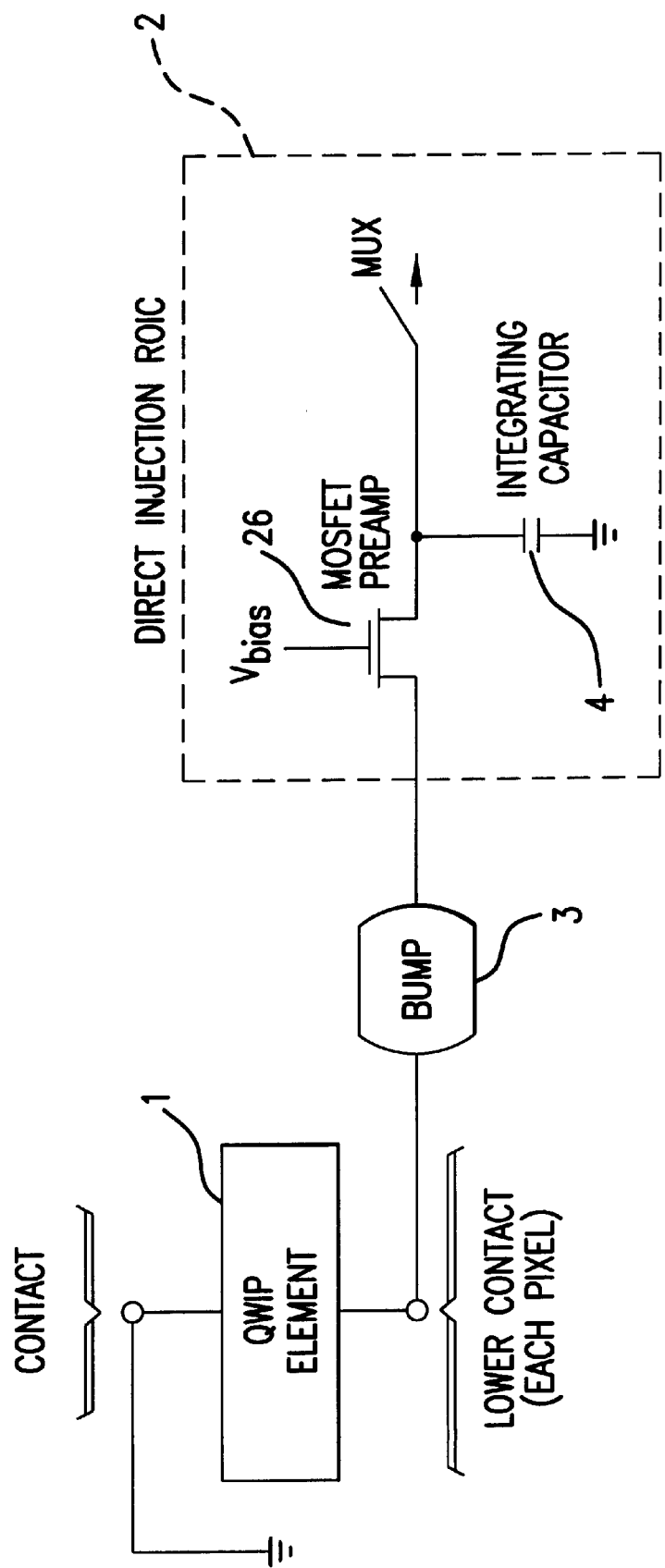
FIG. 1 is a schematic diagram of a prior art quantum well detector that includes the integrating capacitor physically disposed on the Read Out Integrated Circuit unit cell.

In accordance with one aspect of the invention, compensation for variations in detector responsivity is provided by dynamically biasing each detector element with a voltage derived from the voltage across the detector's corresponding charge well. In one embodiment, shown in FIG. 2, this is accomplished by providing a direct connection between the charge well capacitance and the detector output without the presence of any intervening direct injection transistor 26 (see FIG. 1). It will be recognized by those having ordinary skill in the art, that alternative embodiments may include one or more intervening elements between the charge well capacitance and the detector output, so long as the biasing voltage for the detector is primarily derived from the voltage across the charge well capacitance.

Unlike the prior art fixed bias mode, the detector bias voltage ($V_{DET}$) in this exemplary embodiment changes as a function of the charge well voltage. Inspecting the detector photo-current 29 using a narrow band flux approximation yields:

$$i(T) = \tau_o \Omega A_d \eta g q \Phi e^{\left(\frac{-T_p}{T}\right)} \text{ amperes}$$

where:

$\tau_0$ is the optical transmission efficiency,
$\Omega$ is the optical solid viewing angle,
$A_d$ is the pitch area of the detector in cm$^2$,
$\eta$ is the detector quantum efficiency,
g is the photoconductive gain,
q is the electron charge ($1.6*10^{-19}$ coulombs),
$\Phi_p$ is the peak flux in photons/second/cm$^2$/steradian,
$T_p$ is the peak temperature in Kelvin, and
i(T) is the photocurrent in amperes.

Let $K_p = \tau_o A_d \eta q \Phi_p$ then $$i(T) = K_p g e^{\left(\frac{-T_p}{T}\right)} \text{ amperes}$$

The detector thus looks like a photoconductor with photoconductive gain $$g = \frac{\mu_c \tau_c V_{DET}}{t_d^2}$$

where, $t_d$=total super lattice well thickness in centimeters
$\tau_c$=carrier lifetime in seconds
$\mu_c$=carrier mobility in cm$^2$/(volt*second)
$V_{DET}$=detector bias voltage in volts
The detector resistance $R_d$ is then $$R_d = \frac{t_d}{\mu_c \tau_c K_p e^{\left(\frac{-T_p}{T}\right)}} \text{ ohms}$$

and the detector conductance G is therefore $$G = 1/R_d = \frac{\mu_c \tau_c K_p e^{\left(\frac{-T_p}{T}\right)}}{t_d} \text{ siemens}$$

Figure 2:
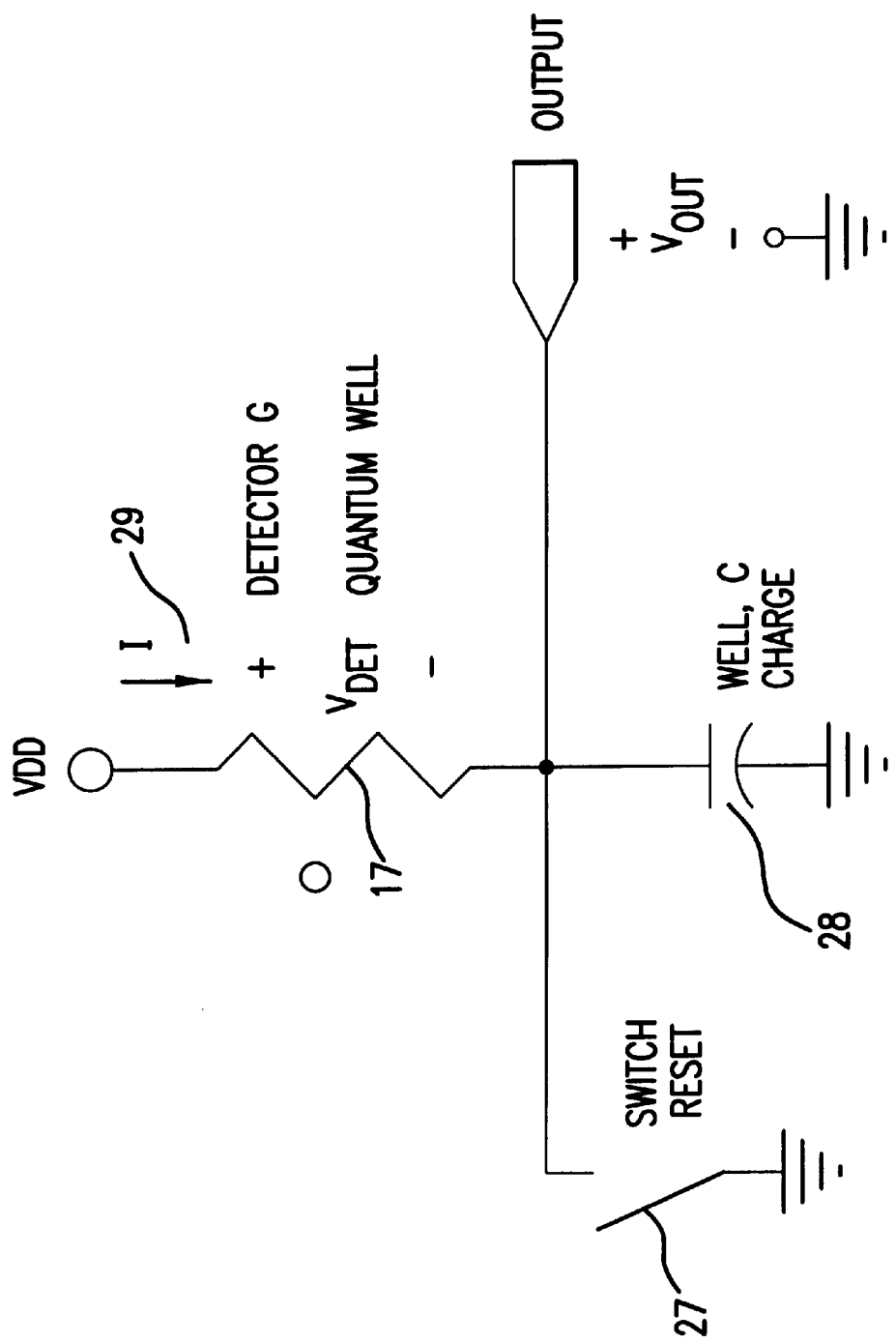
FIG. 2 is a schematic diagram of an aspect of the invention where the charge well is directly coupled to the detector.

In the circuit of FIG. 2, the change in detector bias $V_{DET}$ occurs during operation of the detector when the reset switch 27 is activated to dump the charge accumulated for the previous video frame. The new frame image is collected by charging the well capacitance 28 for a specified time. The time response for the voltage across the charge well in the circuit configuration of FIG. 2 is:

$$V_{OUT}(t) = V_{DD}(1 - e^{-Gt/C}) \text{ volts}$$

where t is the integration period
C is the charge well capacitance
G is the quantum well photo conductance
The bias applied across the detector 17 is therefore a nonlinear exponential voltage. This nonlinear response can be advantageous since it provides a higher bias to low conductance detector elements, and a lower bias to high conductance detector elements. This can be demonstrated by considering the nominal detector conductivity G with a variation of g:

$$G_{max} = G+g \text{ siemens}$$

$$G_{min} = G-g \text{ siemens}$$

The voltage across the detector $V_{DET}$ is the voltage that is proportional to responsivity. The detector voltage can be found by subtracting the output voltage $V_{OUT}$ from the power supply voltage $V_{DD}$. Thus, the nominal voltage across the detector is $$V_{DETnom} = V_{DD} - V_{OUT}(t) = V_{DD} e^{-Gt/C} \text{ volts}$$

It follows then, that for the maximum conductance, the time dependent voltage across the detector is $$V_{DETmax} = V_{DD} e^{-(G+g)t/C} \text{ volts}$$

Similarly, the time dependent voltage for the minimum conductance is $$V_{DETmin} = V_{DD} e^{-(G-g)t/C} \text{ volts}$$

Using the exponential distributive law $$e^{(a-b)x} = e^{ax} e^{bx}$$

then $$V_{DETmax} = V_{DETnom} e^{-gt/C} \text{ volts}$$

and $$V_{DETmin} = V_{DETnom} e^{gt/C} \text{ volts}$$

The following are power series expansions for the exponential functions $e^{-x}$ and $e^x$:

$$e^{-x} = 1 - x + 0.5x^2 - 0.167x^3 + 0.042x^4 - \ldots$$

$$e^x = 1 + x + 0.5x^2 + 0.167x^3 + 0.042x^4 - \ldots$$

Using the first order approximation of these exponential functions in the minimum and maximum detector voltages, the following results are obtained:

$$V_{DETmax} = V_{DETnom}(1 - g/tC) \text{ volts}$$

$$V_{DETmin} = V_{DETnom}(1 + gt/C) \text{ volts}$$

Clearly, the detector voltage for a detector 17 with maximum conductance is less than the voltage across a detector 17 with minimum conductance. Since the detector's responsivity is proportional to the applied bias, the detectors with lower conductance are biased for higher responsivity, and the detectors with higher conductance are biased for lower responsivity. The nonlinear response of this aspect of the invention thus provides an automatic correction for nonuniformities in the photoconductivity of each single detector element in an array.

An additional advantage of the exemplary embodiment is that the signal to noise ratio of the detector output response is significantly improved. It is understood that, in a conventional detector structure, the injector transistor inherently produces low frequency noise (1/f noise) in the output response. In a conventional photodetector this manifests itself as "flicker" noise in the output imagery that can be detected by the human eye. By not utilizing an injector transistor, and instead directly connecting the detector with the charge well, this low frequency "flicker" noise is eliminated.

Operation of a 640×480 FPA using the techniques of this aspect of the invention has been successfully demonstrated and one positive effect of this technique is that 'hot' pixels (high response detectors) are compressed, resulting in a more uniform image with fewer replaced pixels. This technique also compresses the compounded cosine$^4$ ($\theta$) function. The dynamic bias mode produced very good imagery compared with the normal, fixed bias mode.

It is noted that the advantages produced by operation of a FPA using the techniques of this aspect of the invention are contrary to the expectations of one having ordinary skill in the art. That is, conventional thinking in the art would anticipate that the nonlinear biasing of the detector, resulting from elimination of the injector transistor from the ROIC unit cell, would create pattern noise in the detector output signal. However, operation of a photodetector without inclusion of the injector transistor has demonstrated that this is not the case. The nonlinearity of the bias does not produce the expected pattern noise because the bias, though nonlinear in time, is a linear function of the detector conductance. Thus, even with an applied dynamic bias, any variation in detector conductivity produces a corresponding linear change in the output voltage response. The nonlinear bias additionally has the advantage, as discussed previously, of providing correction for nonuniformities in the detector. Thus, the advantages produced by providing a dynamic, rather than fixed bias of the detectors in a FPA would not be intuitively apparent to one having ordinary skill in the art.

As a solution to the problem of limited charge well size and limited array density, another aspect of the present invention relocates the charge well from the unit cell to the physically separate detector structure. With the charge well removed from the ROIC unit cell, the unit cell contains only the necessary active components such as switches, storage well, output buffer, and row switch. Relocation of the relatively large charge well therefore permits a reduction in area of the unit cell which, correspondingly, enables a reduction in pitch of the associated detector. This reduction in detector pitch thus advantageously permits a higher density array configuration which can approach that of a very high density array of greater than 856×480. Further, fabrication of the charge well in the detector beneficially permits construction of larger integration charge wells.

Figure 3:
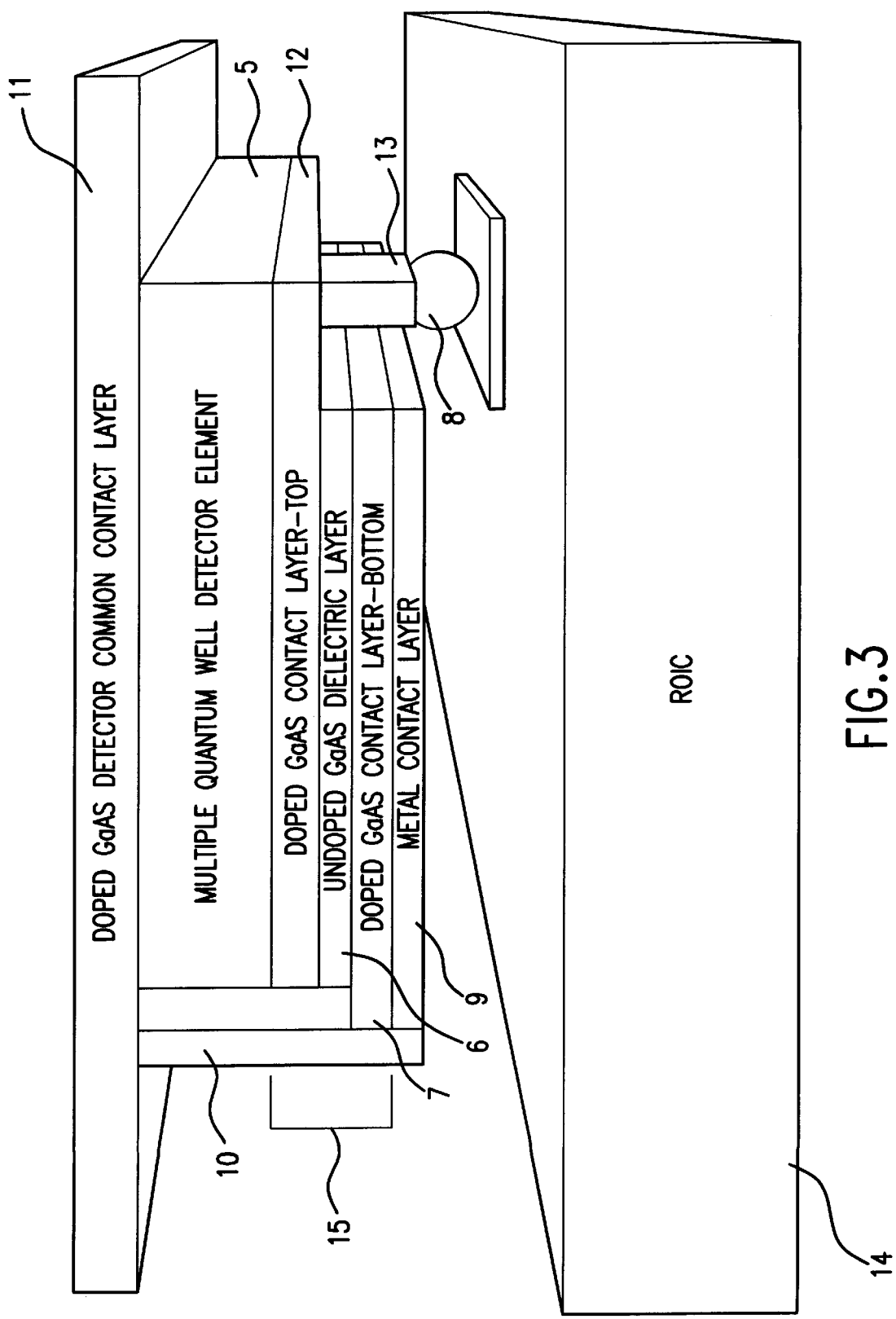
FIG. 3 is a structural diagram of a quantum well detector with integral charge well.

As shown in FIG. 3, an exemplary structure is provided wherein the integration charge well is fabricated in the detector and not the ROIC unit cell. This is accomplished by either growing or depositing a suitable dielectric 6, a secondary contact layer 7, and an interface bump 8 onto a QWIP detector 5. A number of compounds can be used for the dielectric 6 including SiO, $SiO_2$, ZnS, and $MgF_2$. However, a better dielectric is GaAs, which is already an inherent element in the fabrication of a conventional GaAs/AlGaAs Quantum Well detector. The GaAs dielectric consists of an undoped epitaxially grown GaAs layer. The same Molecular Beam Epitaxy (MBE) growth process used to construct the Quantum Well detector structure may be used to produce the dielectric layer. This process produces a very accurate and uniform dielectric layer in addition to providing the benefit of being a grown, instead of a deposited, layer.

As a representative example, a 50 Angstrom undoped GaAs dielectric would produce a capacitance per unit area in a charge well of 23 femtoFarads per square micron. For the 22 $\mu$m×22 $\mu$m active area in a 640×480 detector, this results in a charge well capacitance of over 1.1 picoFarads. In contrast, the prior art 640×480 ROIC unit cell has a 340 femtoFarad charge well capacitance.

Referring back to the exemplary embodiment of the charge well illustrated in FIG. 3, the common contact layer 11 is formed over a multiple quantum well detector 5 which further overlays a doped GaAs top contact layer 12. The combination of the contact layer 12 with two subsequent layers, an undoped GaAs dielectric layer 6 and a doped GaAs bottom contact layer 7, forms the integral charge well capacitance 15. The bottom layer 7 of the charge well further overlays a metal contact layer 9. Both layers 7 and 9 are connected by a metal via 10 back to the doped GaAs common contact layer 11. An indium bump 8 is connected through a metal post 13 to the top doped GaAs contact layer 12. As shown in FIG. 3, the indium bump 8 provides the electrical connection to the underlying ROIC unit cell structure 14.

Figure 4:
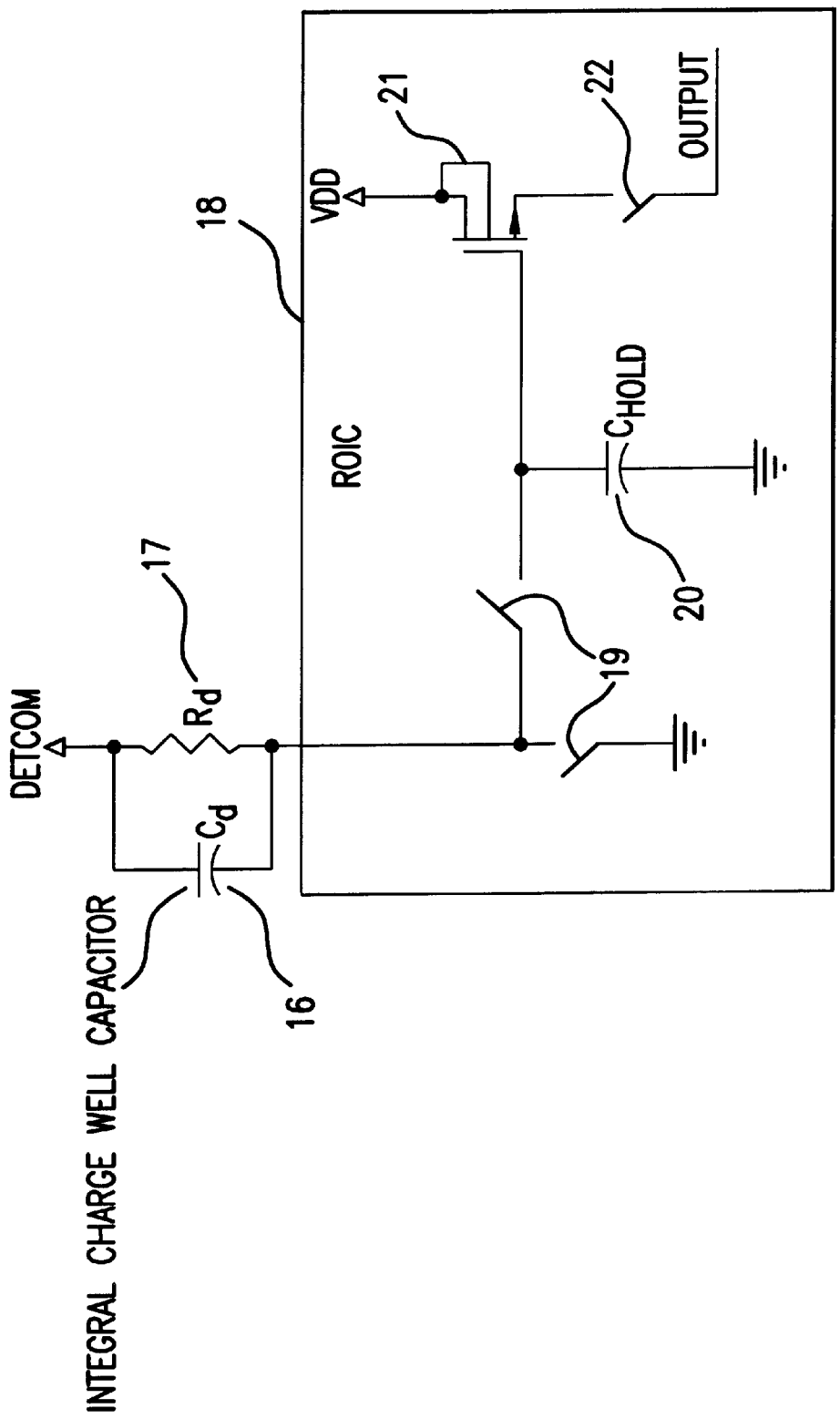
FIG. 4 is a simplified schematic diagram of the integral charge well detector and ROIC in accordance with an aspect of the present invention.

A simplified schematic diagram of the integral charge well detector and the ROIC unit cell output element (also referred to throughout the disclosure simply as "output element") of FIG. 3 is shown in FIG. 4. The combination 16 of the detector capacitance and integral charge well capacitance 15 is represented by $C_d$. $R_d$ represents the simplified detector resistance 17. A separate ROIC unit cell 18 has interconnected switches 19, storage well capacitance $C_{hold}$ 20, output buffer 21, and output row switch 22. The voltage response across the detector in the dynamic bias mode is:

$$v(t) = V_{DETcom}\left[1 - e^{\left(\frac{-t}{R_d C_d}\right)}\right]$$

for a fixed integration time, $\tau_i$, this becomes $$v(t_i, T) = V_{DETcom}\left[1 - e^{\left(\frac{-\tau_i}{R_d C_d}\right)}\right] = V_{DETcom}\left[1 - e^{\frac{-\tau_i T_c \mu_c K_p e^{\left(-\frac{T_p}{T}\right)}}{t_d^2 C_d}}\right]$$

Figure 5A:
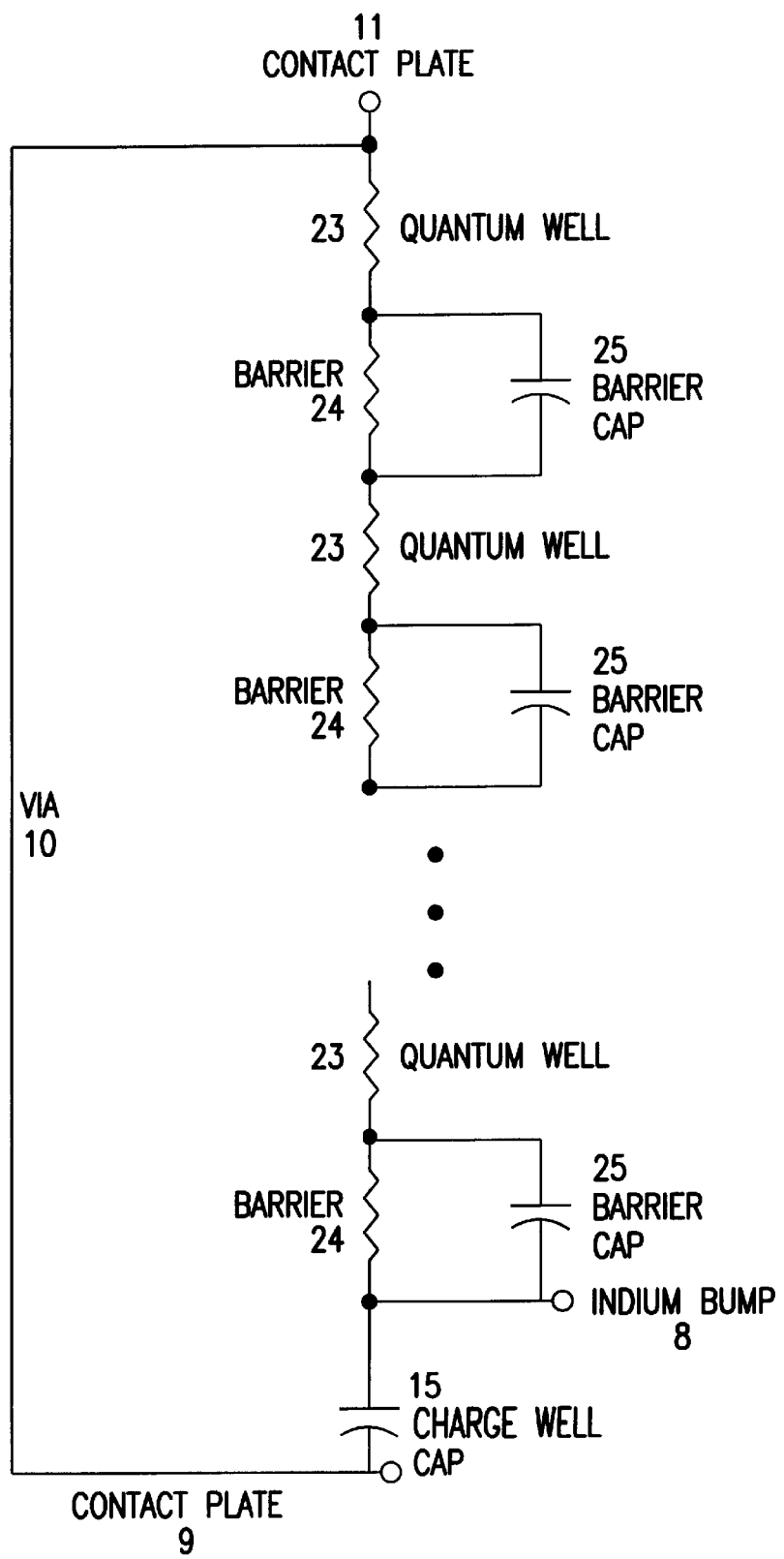
FIG. 5(*a*) is an expanded schematic diagram of the multiple quantum well detector with integral charge well.
Figure 5B:
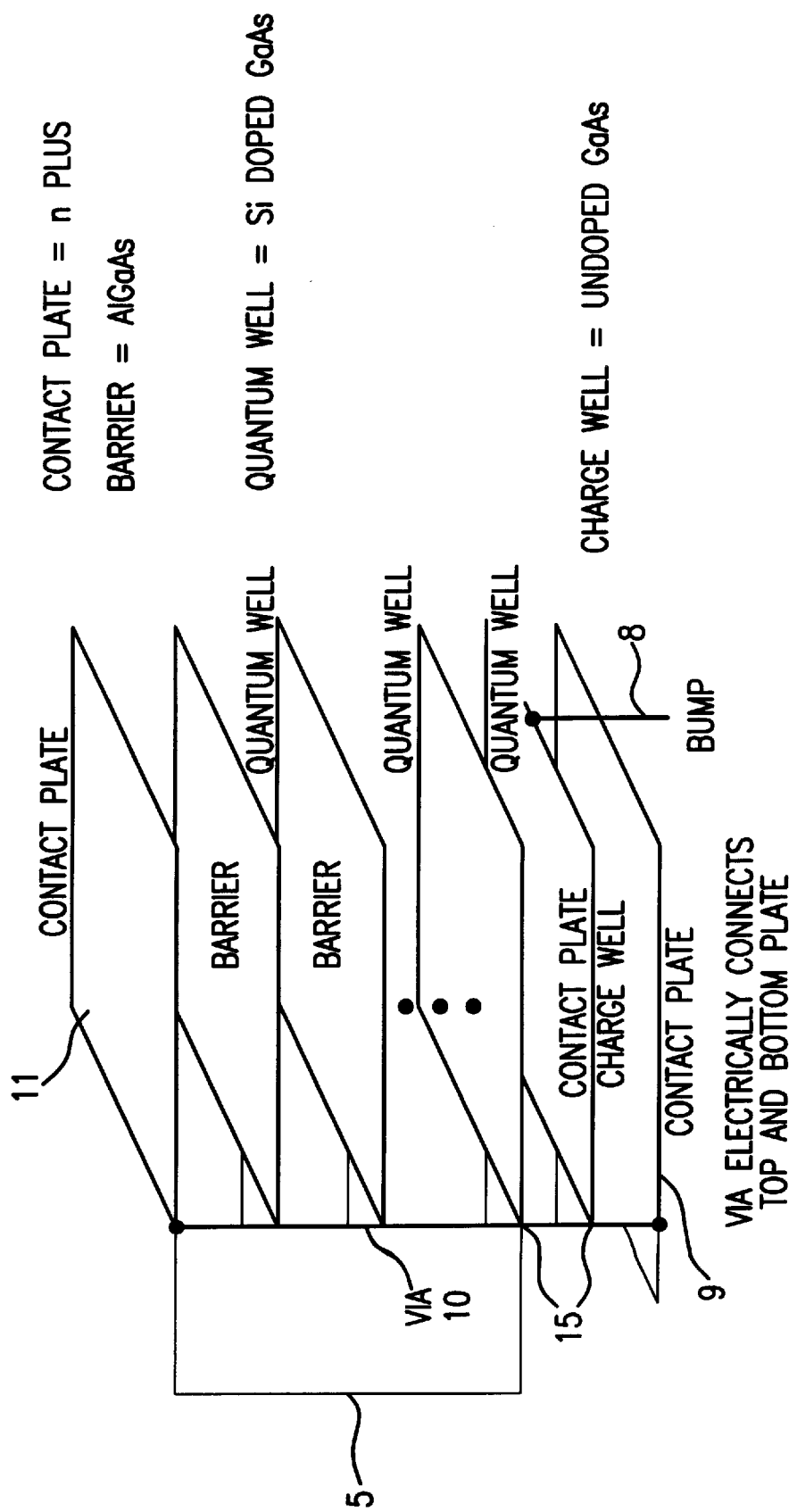

An expanded schematic diagram of the simplified detector elements ($C_d$ and $R_d$) of FIG. 4 is further shown in FIG. 5(a). Here, the details of the Multiple Quantum Well detector with integral charge well 5 are demonstrated. The multiple quantum wells are modeled as alternating quantum well resistances 23 in series with a parallel combination of barrier resistances 24 and barrier capacitances 25. The charge well capacitance, physically configured in FIG. 3 as the undoped GaAs dielectric Layer 6 sandwiched between the doped GaAs contact layers 7 and 12, is shown as the charge well capacitance 15. The charge well capacitance 15 is connected by the contact plate 9 through the via 10 to the contact plate 11. Also shown is the indium bump 8 electrically connected to the multiple quantum well detector. FIG. 5(b) illustrates the elements of the expanded schematic of FIG. 5(a) configured in the structural layers previously discussed in conjunction with FIG. 3.

In summary, an improved quantum well infrared photodetector structure that has significant advantages over the prior art has been described. By removing the prior art injection transistor from the ROIC, a direct connection between the charge well and the detector output is provided. This direct connection enables the voltage across the charge well to be used as a dynamic bias voltage for the detector. Dynamic biasing of the detector beneficially results in automatic response correction and a reduction in low frequency noise. Elimination of the need for an injection transistor further enables the relocation of the charge well from the ROIC. Without the need for an intervening injection transistor between the detector output and the charge well, it becomes feasible to relocate the charge well from the ROIC onto the detector structure. This relocation advantageously makes possible the fabrication of larger charge wells and higher density arrays.

Although a number of embodiments are described herein for purposes of illustration, these embodiments are not meant to be limiting. Those of ordinary skill in the art will recognize modifications that can be made in the illustrated embodiment. Such modifications are meant to be covered by the spirit and scope of the appended claims. For example, fabrication of the integration charge well in the Quantum Well Infrared Photo detector array may be equally applied to any size integrating infrared detector array.

What is claimed is:

1. A radiation photodetector comprising:
   a detector element; and
   a charge well fabricated on the detector element.

2. The radiation photodetector of claim 1, wherein the charge well further comprises:
   a first layer of a first conductivity, the first layer formed on a first surface of the detector element;
   a dielectric layer formed on the first layer; and
   a second layer of a second conductivity, the second layer formed on the dielectric layer.

3. The radiation photodetector of claim 2, further comprising:
   a third layer of a third conductivity, the third layer formed on a second surface of the detector element;
   a metal contact layer formed on the second layer; and
   a contact interconnecting the metal contact layer with the third layer.

4. The radiation photodetector of claim 2, wherein the dielectric layer is composed of undoped GaAs.

5. The radiation photodetector of claim 2, wherein the dielectric layer is selected from the group consisting of SiO, $SiO_2$, ZnS, and $MgF_2$.

6. The radiation photodetector of claim 2, wherein the dielectric layer is composed of undoped GaAs and the first and second layers are composed of doped GaAs.

7. The radiation photodetector of claim 2, further comprising:
   an output element; and
   a contact interconnecting the output element with the second layer.

8. The radiation photodetector of claim 7, wherein the output element includes a storage well connected to the contact, an output buffer connected to the storage well, and an output row switch connected to an output of the buffer.

9. The radiation photodetector of claim 1, further comprising:
   a read out integrated circuit unit cell for receiving an integrated charge from the charge well and supplying the charge to an output;
   an interface bump interconnecting the charge well with the unit cell.

10. A radiation photodetector comprising:
    a detector element; and
    a charge well fabricated on the detector element;
    wherein the detector element is a quantum well detector element.

11. The radiation photodetector of claim 10, wherein the quantum well detector element is a multiple quantum well detector element.

12. A photodetector array comprising:
    a plurality of photodetector elements, each comprising:
       a charge well capacitance fabricated on the photodetector element;
       an output element; and
       a contact that interconnects the photodetector element with the output element.

13. The photodetector array of claim 12, wherein each of the charge well capacitances comprises:
    a first layer of a first conductivity, the first layer formed on the detector element;
    a dielectric layer formed on the first layer; and
    a second layer of a second conductivity, the second layer formed on the dielectric layer.

14. The photodetector array of claim 13, wherein the plurality of detector elements are configured in a very high density array.

15. The photodetector array of claim 14, wherein the very high density array configuration is at least 856×480.

16. The photodetector array of claim 13, wherein each of the plurality of detector elements are quantum well detector elements.

17. The photodetector array of claim 16, wherein each of the plurality of quantum well detector elements are multiple quantum well detector elements.

18. The photodetector array of claim 13, wherein the dielectric layer is composed of undoped GaAs.

19. The photodetector array of claim 13, wherein the dielectric layer is selected from the group consisting of SiO, $SiO_2$, ZnS, and $MgF_2$.

20. The photodetector array of claim 13, wherein the dielectric layer is composed of undoped GaAs and the first and second layers are composed of doped GaAs.

21. A radiation photodetector comprising:
    a detector structure; and
    a charge well fabricated on the detector structure coupled to provide a bias voltage to the detector structure.

22. The radiation photodetector of claim 21 further comprising:
    a power supply coupled to the detector structure;
    a switch coupled with the charge well, wherein operation of the switch alternately charges and discharges the charge well so as to periodically reset the detector bias voltage.

23. The radiation photodetector of claim 22, wherein the detector bias voltage is an exponential bias voltage.

24. A method of detecting radiation comprising the steps of:
    receiving the radiation in a detector structure including a charge well fabricated on a detector element;
    converting the received radiation into moving charges;
    storing some portion of the moving charges in the charge well; and
    biasing the detector structure with a voltage derived from the charges stored in the charge well.

25. A method of detecting radiation comprising the steps of:
    receiving the radiation in a detector structure that includes a charge well fabricated on a detector element;
    converting the received radiation into moving charges;
    storing some portion of the moving charges in the charge well; and supplying a measure of the stored charges to a read out integrated circuit unit cell.

* * * * *